(12) United States Patent
Tsumori

(10) Patent No.: US 7,093,988 B2
(45) Date of Patent: Aug. 22, 2006

(54) BI-DIRECTIONAL OPTICAL TRANSCEIVER MODULE WITH DOUBLE CAPS AND METHOD OF IMPROVING THE EFFICIENCY AND THE RELIABILITY OF SAME

(75) Inventor: Masahiko Tsumori, Suwon-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 269 days.

(21) Appl. No.: 10/638,975

(22) Filed: Aug. 12, 2003

(65) Prior Publication Data
US 2004/0071413 A1   Apr. 15, 2004

(30) Foreign Application Priority Data
Oct. 10, 2002   (KR) .................. 10-2002-0061800

(51) Int. Cl.
G02B 6/42 (2006.01)
(52) U.S. Cl. ............... 385/93; 385/92; 398/135; 398/139
(58) Field of Classification Search ............ 385/88–93; 398/135–142
See application file for complete search history.

(56) References Cited

U.S. PATENT DOCUMENTS

| 5,127,075 | A | 6/1992 | Althaus et al. ............... 385/94 |
| 5,408,559 | A | 4/1995 | Takahashi et al. ............ 385/89 |
| 5,416,624 | A | 5/1995 | Karstensen ................. 359/114 |
| 6,040,934 | A | 3/2000 | Ogusu et al. ............... 359/152 |
| 6,092,935 | A * | 7/2000 | Althaus et al. ............... 385/93 |
| 6,340,831 | B1 * | 1/2002 | Kuhara et al. ............. 257/461 |
| 6,748,143 | B1 * | 6/2004 | Kuhara et al. ................ 385/49 |
| 6,757,460 | B1 * | 6/2004 | Melchior et al. ............ 385/31 |
| 6,792,181 | B1 * | 9/2004 | Sasaki ........................ 385/37 |
| 6,854,897 | B1 * | 2/2005 | Furumai et al. ............. 385/73 |

* cited by examiner

Primary Examiner—Akm Enayet Ullah
Assistant Examiner—Kevin S. Wood
(74) Attorney, Agent, or Firm—Cha & Reiter, L.L.C.

(57) ABSTRACT

The disclosed invention relates to a bi-directional optical transceiver module and method of improving the efficiency and reliability of the same, where interference from optical crosstalk and electromagnetic waves are minimized and a wavelength division multiplexing filter can be easily mounted at a predetermined inclination angle, thereby improving the efficiency and reliability of the bi-directional optical transceiver module.

10 Claims, 6 Drawing Sheets

BI-DIRECTIONAL OPTICAL TRANSCEIVER MODULE WITH DOUBLE CAPS AND METHOD OF IMPROVING THE EFFICIENCY AND THE RELIABILITY OF SAME

CLAIM OF PRIORITY

This application claims priority to an application entitled "BI-DIRECTIONAL OPTICAL TRANSCEIVER MODULE WITH DOUBLE CAPS," filed in the Korean Intellectual Property Office on Oct. 10, 2002 and assigned Serial No. 02-61800, the contents of which are hereby incorporated by reference.

BACKGROUND OF THE INVENTION

1. Field of the Invention

The present invention relates to a bi-directional optical transceiver module with double caps. More particularly, the present invention relates to a bi-directional optical transceiver module having double caps in which elements, such as a semiconductor laser and a photodiode, are integrated.

2. Description of the Related Art

Referring to FIG. 1 showing the construction of a conventional bi-directional optical transceiver module, the conventional bi-directional optical transceiver module includes an optical waveguide element 132, a sleeve 131, a lens holder 120 serving as a body tube and having a cylindrical construction, a lens 140 converging each of input and output optical signals, a stem 114 supporting a lower end of the lens holder 120, and a cap 110 disposed on the stem 114.

The optical waveguide element 132 is packaged in the sleeve 131. The optical waveguide element 132 serves as a medium through which an input optical signal 160 or an output optical signal 170 is transmitted when they are inputted into or outputted from the bi-directional optical transceiver module, respectively.

The lens holder 120 has a cylindrical construction, supports the lens 140, and serves as a body tube forming a passage for the input optical signal 160 and the output optical signal 170. The optical waveguide element 132 is inserted and fixed in an upper end of the lens holder 120.

The lens 140 is an element for converging the input optical signal 160 inward of the cap 110 and the output optical signal 170 toward the inserted end of the optical waveguide element 132 and is packaged in an upper portion of the lens holder 120. In general, the input optical signal 160 and the output optical signal 170 have different wavelengths than each other.

Referring to FIG. 2, the cap 110 is assembled with and covered on the upper surface of the stem 114. The cap 110 has a hole formed through a central portion thereof, so that the input and output optical signals can be transmitted and received through the hole. Further, a view window 117 is disposed just under the hole. The view window 117 prevents foreign material from coming into the cap 110 while allowing the input and output optical signals to pass through the view window 117.

The contents of the cap 110 include optical elements such as a photodiode 112, a semiconductor laser 113, and a wavelength division multiplexing filter 115. The photodiode 112 receives the input optical signal 160 and converts it to a corresponding electrical signal. The semiconductor laser 113 modulates the electrical signal into the output optical signal 170. The wavelength division multiplexing filter 115 separates the input optical signal 160 and the output optical signal 170 from each other and transmits them through their own respective paths.

The stem 114 is formed in a plurality of holes (not shown) passing through both faces, and a plurality of the metal lead wires 150 of the hole are arrayed to protrude its portion on the upper face of the stem 114. The holes which the metal lead wires 150 are arrayed are filled with a sealing material (not shown) for fixing the metal lead wires 150. The metal lead wires 150 comprises a direct current (DC bias lead), a high-frequency lead connected to a cathode of the semiconductor laser 113, an anode lead connected to an anode of the photodiode 112 for monitoring an optical element outputted from the semiconductor laser 113, and a common lead connected to a cathode of the semiconductor laser 113 and the photodiode 112.

The photodiode 112 is created for monitoring the optical element outputted from the semiconductor laser 113 on the stem 114, and each of the semiconductor laser 113 and the photodiode 112 is electrically connected to metal lead wires 180 by each of the leads 150 and a wire bonding method.

The stem 114 serves as a substrate for the optical elements housed in the cap 110 and supports the lower end of the lens holder 120.

The advantage of a conventional bi-directional optical transceiver module is that it allows the packaging of a semiconductor laser and a photodiode together in a cap, thereby giving the conventional bi-directional optical transceiver module a relatively small volume where it may be employed in a relatively small optical system.

However, in the conventional bi-directional optical transceiver module, much time is required in assembling the wavelength division multiplexing filter, since the wavelength division multiplexing filter must be mounted at a predetermined angle in the optical path of the input and output optical signals. Further, when a portion of scattered or diffusion-reflected light generated in the wavelength division multiplexing filter, view window, or other elements in the path of the optical signals are introduced into the photodiode, they are superimposed on the normal input optical signal causing optical crosstalk. In addition, the electromagnetic waves generated by the lead wires of the semiconductor laser may also be introduced into the photodiode causing further interference with the electrical signal created in the photodiode.

SUMMARY OF THE INVENTION

Accordingly, there is a need to provide a bi-directional optical transceiver module where optical crosstalk or interference between the input and output optical signals are minimized to provide a bi-directional optical transceiver module with improved efficiency and reliability.

According to one aspect of the invention, a bi-directional optical transceiver module is provided with a wavelength division multiplexing filter that may be more easily mounted.

According to another aspect of the invention, further efficiency and reliability may be achieved by providing a bi-directional optical transceiver module where the electromagnetic Waves created by the metal lead wires connected to the semiconductor laser do not interfere with the operation of a photodiode converting an optical signal into an electrical signal.

Accordingly, there is provided a bi-directional optical transceiver module comprising: an optical waveguide element through which input and output optical signals pass; a lens holder in an upper end of which the optical waveguide element is inserted and fixed, the lens holder thereby serving as a body tube; a lens disposed at an upper portion in the lens holder, the lens converging each of the input and output optical signals; a stem supporting a lower end of the lens holder; an outer cap disposed on the stem, the outer cap enclosing a photodiode for receiving an input optical signal and converting it to a corresponding electrical signal; a semiconductor laser for modulating the electrical signal into a corresponding output optical signal; a wavelength division multiplexing filter placed at a location with a predetermined inclination angle where the input and output optical signals intersect one another; and an inner cap mounted within the outer cap isolating the photodiode preventing the electromagnetic waves generated by the metal lead wires of the semiconductor laser from interfering with the operation of the photodiode.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE PREFERRED EMBODIMENT

In accordance with the present invention, a preferred embodiment of the present invention will be described with reference to the accompanying drawings. For the purposes of clarity and simplicity, a detailed description of known functions and configurations incorporated herein will be omitted as it may make the subject matter of the present invention unclear.

Figure 1:
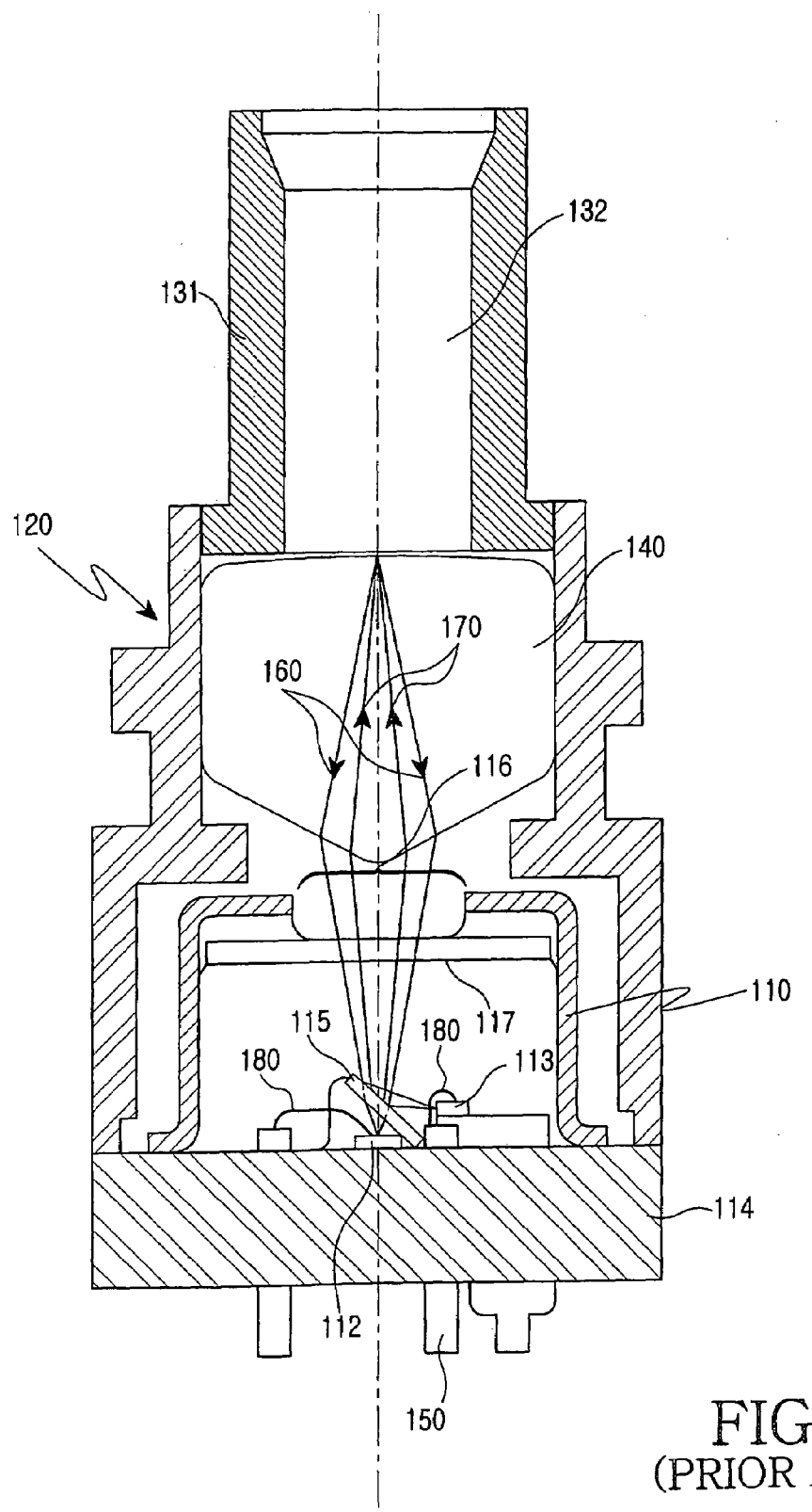
FIG. 1 is a sectional view showing a construction of a conventional bi-directional optical transceiver module.
Figure 2:
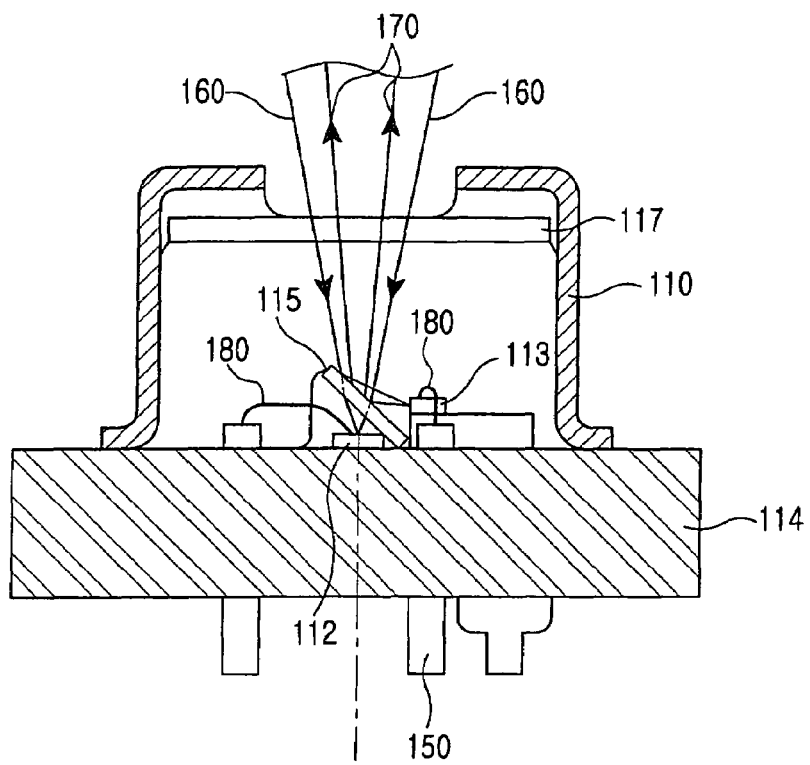
FIG. 2 is a sectional view showing a construction of a cap employed in a conventional bi-directional optical transceiver module.
Figure 3:
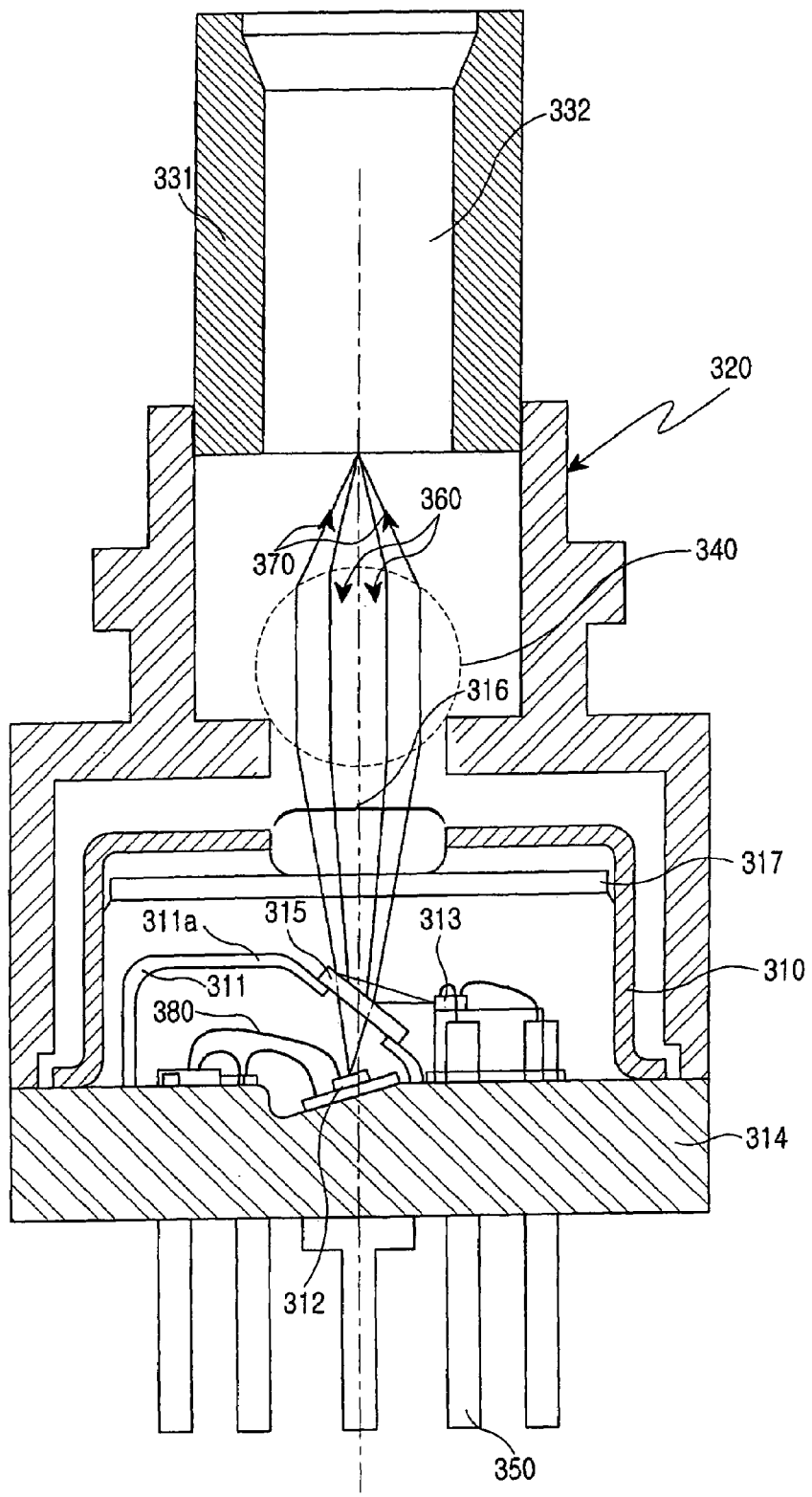
FIG. 3 is a sectional view showing a construction of a bi-directional optical transceiver module according to the present invention.

Referring to FIG. 3 showing a construction of a bi-directional optical transceiver module having double caps according to a preferred embodiment of the present invention, the bi-directional optical transceiver module includes an optical waveguide element 332, a sleeve 331, a lens holder 320 having a cylindrical construction and serving as a body tube, a lens 340 disposed at an upper portion in the lens holder 320, a stem 314 supporting a lower end of the lens holder 320, an outer cap 310 disposed on the stem 314, and an inner cap 311 mounted in the outer cap 310.

The optical waveguide element 332 is packaged in the sleeve 331. The optical waveguide element 332 serves as a medium through which an input optical signal 360 or an output optical signal 370 is transmitted when they are input into or output from the bi-directional optical transceiver module, respectively. In general, the input optical signal 360 and the output optical signal 370 have different wavelengths than each other.

The lens holder 320 has a cylindrical construction, it supports the lens 340, and serves as a body tube forming a passage for the input optical signal 360 and the output optical signal 370. The optical waveguide element 332 is inserted and fixed in an upper end of the lens holder 320.

The lens 340 is an element for converging the input optical signal 360 inward of the cap 310 and the output optical signal 370 toward the inserted end of the optical waveguide element 332 and is packaged in an upper portion of the lens holder 320. A non-spherical lens may be employed as the lens 340.

The stem 314 supports the lower end of the lens holder 320 and serves as a substrate for the optical elements housed in the outer cap 310. A photodiode 312 and a plurality of metal lead wires 350 for operating a semiconductor laser 313 protrude downward from a lower surface of the stem 314. The metal lead wires 350 connected to the semiconductor laser 313 serve as conductors for the high-frequency electrical signals that are input into the semiconductor laser 313 from the photodiode 312.

Figure 4:
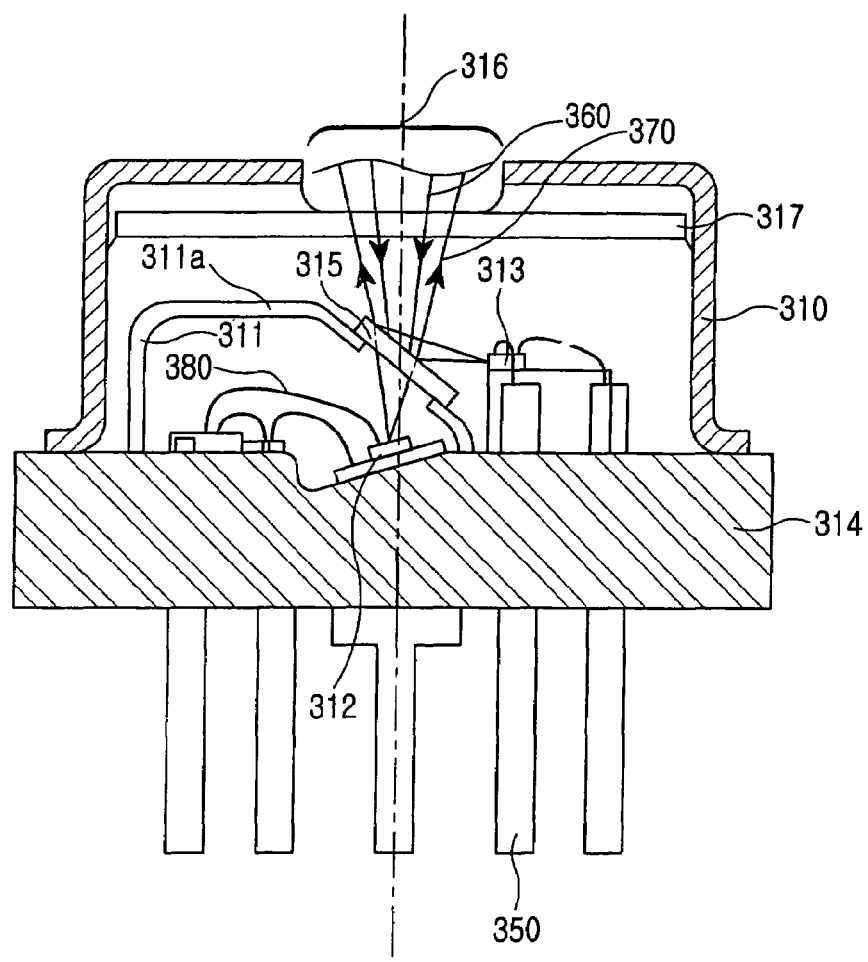
FIG. 4 is a sectional view showing a construction of double caps employed in the bi-directional optical transceiver module shown in FIG. 3.
Figure 5:
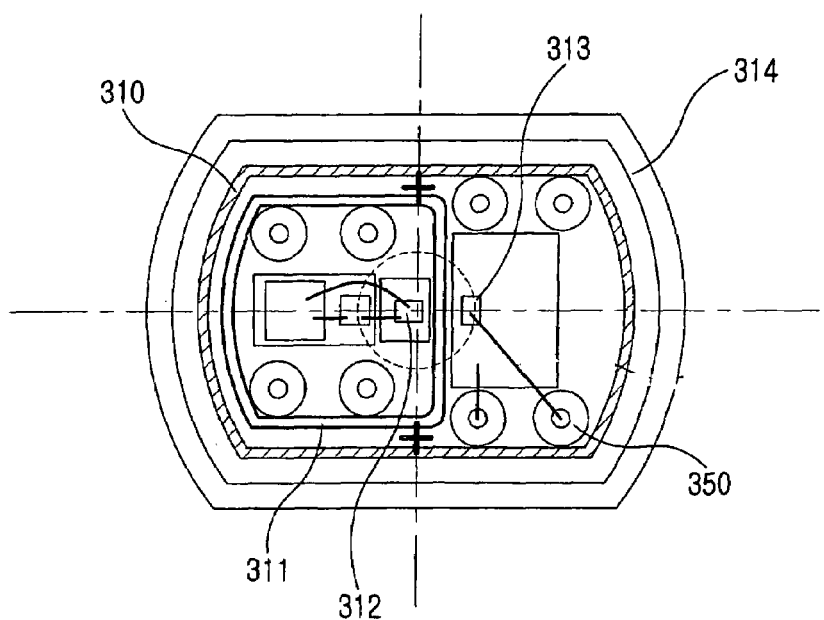
FIG. 5 is a sectional view showing the construction of the double caps shown in FIG. 4.

Referring to FIGS. 4 and 5, the outer cap 310 is assembled with the stem for covering the upper surface of the stem 314. The outer cap 310 has a hole 316 formed through a central portion thereof, so that the input and output optical signals can be transmitted and received through the hole 316. Further, a view window 317 is disposed just under the hole 316. The view window 317 prevents foreign material from coming into the outer cap 310 and allows the input and output optical signals to pass through the view window 317.

In the outer cap 310, optical elements such as the photodiode 312, the semiconductor laser 313, and a wavelength division multiplexing filter 315 are enclosed. The photodiode 312 receives the input optical signal 360 and converts it to an electrical signal. The semiconductor laser 313 modulates the electrical signal into the output optical signal 370. The wavelength division multiplexing filter 315 separates the input optical signal 360 and the output optical signal 370 from each other and transmits them through their own respective paths.

The wavelength division multiplexing filter 315 is inclined at a predetermined angle and placed at a location where the input optical signal 360 and the output optical signal 370 intersect each other, so as to selectively transmit or reflect the input optical signal 360 and the output optical signal 370. That is, the wavelength division multiplexing filter 315 is a device for separating the input optical signal 360 and the output optical signal 370 from each other, so as to prevent them from being superimposed upon one another and allow them to proceed along their individual optical paths without experiencing interference from one another.

The inner cap 311 is mounted in the outer cap 310, having an inclined section 311a extending from the inner cap at the same inclination angle as the inclination angle of the wavelength division multiplexing filter 315. Further, the inner cap 311 encloses the photodiode 312, thereby isolating the photodiode 312 from the other components contained within the outer cap 310. This feature effectively intercepts any scattered or diffusion-reflected lights which may be introduced into the photodiode 312 from outside of the inner cap 311 by isolating the photodiode 312 from the exterior. In other words, the inner cap 311 prevents generation of noise and optical crosstalk by intercepting the scattered or diffusion-reflected lights. It is preferable that the inner cap 311 be made from material so as to prevent electromagnetic waves from reaching the photodiode 312 thereby preventing the electromagnetic waves from interfering with the electrical signal. Further, the inclined section 311a has a hole formed therein, through which the input optical signal 360 or the output optical signal 370 can be received or transmitted, respectively.

The wavelength division multiplexing filter 315 is placed on the inclined section 311a whereby the wavelength division multiplexing filter is at the same inclination angle with respect to the inner cap 311 and the other components of the bi-directional optical transceiver module, thereby bypassing any adjustment to the inclination angle of the wavelength division multiplexing filter that would be necessary for a conventional bi-directional transceiver module. Accordingly, this feature reduces assembly time.

Figure 6:
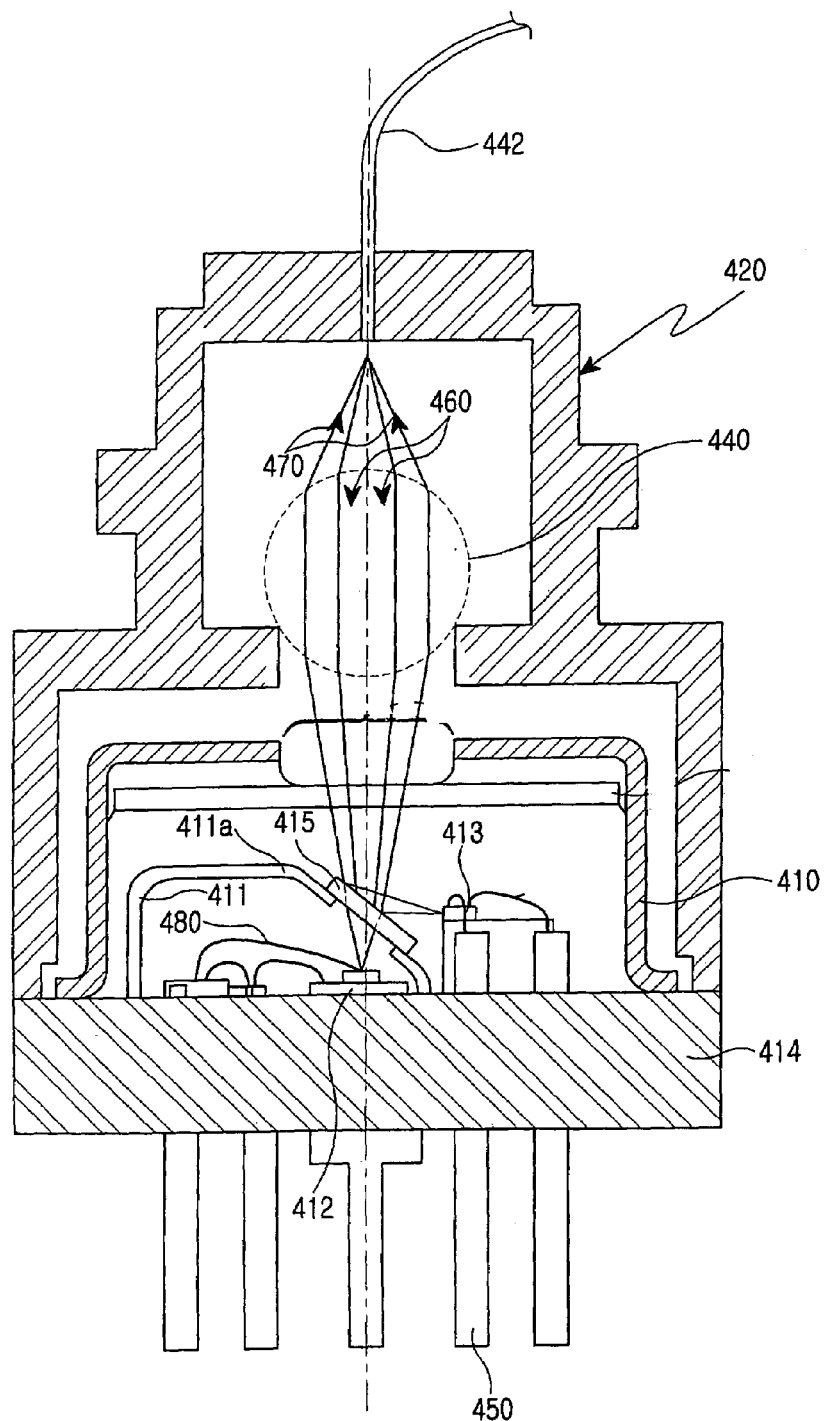
FIG. 6 is a construction of a bi-directional optical transceiver module having double caps according to a preferred embodiment of the present invention.

Referring to FIG. 6 showing a construction of a bi-directional optical transceiver module having double caps according to a preferred embodiment of the present invention, the bi-directional optical transceiver module includes an optical fiber 442, a lens holder 420 serving as a body tube and having a cylindrical construction, a lens 440 disposed at an upper portion in the lens holder 420, a stem 414 supporting a lower end of the lens holder 420, an outer cap 410 disposed on the stem 414, and an inner cap 411 mounted in the outer cap 410.

The optical fiber 442 is assembled with the lens holder 420. The optical fiber 442 serves as a medium through which an input optical signal 460 or an output optical signal 470.

As described above, in a bi-directional optical transceiver module having outer and inner caps according to the present invention, the time for assembly is reduced, any optical crosstalk is reduced, and electromagnetic waves generated in a semiconductor laser 413 are prevented from reaching the photodiode, so that a photodiode may efficiently generate electrical signals without interference from any crosstalk or electromagnetic waves.

In a bi-directional optical transceiver module according to the present invention, an inner cap having an inclined section 411a with a wavelength division multiplexing filter 415 disposed thereon, having the same inclination angle as the inclined portion of the inner cap, all contained within an outer cap so that the wavelength division multiplexing filter can be easily assembled reducing time for the assembly process. Further, in the bi-directional optical transceiver module, the inner cap is made of material encapsulating a photodiode 412 and preventing interference from electromagnetic waves in the operation of the photodiode. Without such interference the photodiode is more efficient and precise in converting an optical signal into an electrical signal. The inner cap also prevents any scattered or diffusion-reflected lights from reaching the photodiode by isolating the photodiode, thereby minimizing the optical crosstalk.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A bi-directional optical transceiver module comprising:
   an optical waveguide element through which input and output optical signals pass through;
   a lens holder in an upper end of which the optical waveguide element is inserted and fixed, the lens holder thereby serving as a body tube;
   a lens disposed at an upper portion in the lens holder, the lens converging each of the input and output optical signals;
   a stem supporting a lower end of the lens holder;
   an outer cap disposed on the stem, the outer cap enclosing a photodiode for receiving an optical input signal and converting it to an electrical signal, a semiconductor laser that modulates the electrical signal into an optical output signal, and a wavelength division multiplexing filter; and,
   an inner cap mounted in the outer cap that further isolates the photodiode.

2. The apparatus as claimed in claim 1, the lens is a non-spherical lens.

3. The apparatus as claimed in claim 1, the lens is a spherical lens.

4. The apparatus as claimed in claim 1, wherein the wavelength division multiplexing filter is placed at a predetermined inclination angle at a location where the optical input and output signals intersect one another.

5. The apparatus as claimed in claim 4, wherein the inner cap has an inclined section extending at an inclination angle equal to the inclination angle of the wavelength division multiplexing filter, with the wavelength division multiplexing filter placed on the inclined section of the inner cap.

6. The apparatus as claimed in claim 5, wherein the inner cap is constructed of a material capable of preventing electromagnetic waves from penetrating.

7. The apparatus as claimed in claim 6, wherein the inner cap encloses the photodiode, thereby preventing scattered light and diffusion-reflected light from being introduced into the photodiode.

8. A bi-directional optical transceiver module comprising:
   an optical fiber through which input and output optical signals pass through;
   a lens holder in an upper end of which the optical fiber is inserted and fixed for serving as a body tube;
   a lens disposed at an upper portion in the lens holder, the lens converging each of the input and output optical signals;
   a stem supporting a lower end of the lens holder;
   an outer cap disposed on the stem, the outer cap enclosing a photodiode for receiving an optical input signal and covering it to an electrical signal, a semiconductor laser that modulates the electrical signal into an optical output signal, and a wavelength division multiplexing filter; and,
   an inner cap mounted in the outer cap constructed of a material capable of withstanding electromagnetic waves from penetrating, the inner cap further encapsulating the photodiode preventing scattered light and diffusion-reflected light from being introduced into the photodiode.

9. The apparatus as claimed in claim 8, wherein the wavelength division multiplexing filter is placed at a predetermined inclination angle at a location where the optical input and output signals intersect one another.

10. The apparatus as claimed in claim 9, wherein the inner cap has an inclined section extending at an inclination angle equal to the inclination angle of the wavelength division multiplexing filter, with the wavelength division multiplexing filter placed on the inclined section of the inner cap.

* * * * *